United States Patent [19]
Andersson et al.

[11] Patent Number: 6,117,567
[45] Date of Patent: Sep. 12, 2000

[54] DEVICE FOR PRODUCING VOLTAGE CONTROLLED COLOR WITH ELECTROLUMINESCENCE, AND METHOD OF MAKING THE SAME

[75] Inventors: Mats R. Andersson, Alafors; Rolf M. Berggren; Bengt G. Gustafsson, both of Linköping; Ulf T. Hjertberg, Göteborg; Olle W. Inganäs; Arne M. Granström, both of Linköping, all of Sweden

[73] Assignee: Forskarpatent i Linkoping AB, Linkoping, Sweden

[21] Appl. No.: 08/737,572

[22] PCT Filed: May 16, 1995

[86] PCT No.: PCT/SE95/00549

§ 371 Date: Apr. 17, 1997

§ 102(e) Date: Apr. 17, 1997

[87] PCT Pub. No.: WO95/31515

PCT Pub. Date: Nov. 23, 1995

[30] Foreign Application Priority Data

May 17, 1994 [SE] Sweden .................................. 9401688

[51] Int. Cl.[7] ...................................................... H05B 33/14
[52] U.S. Cl. ...................... 428/690; 428/917; 428/411.1; 313/502; 313/504; 313/506; 257/40; 257/103; 427/66; 315/291
[58] Field of Search ..................................... 428/690, 917, 428/457, 411.1; 313/502, 504, 506; 257/40, 86, 89, 103; 427/66; 315/291, 307

[56] References Cited

U.S. PATENT DOCUMENTS 5,425,125 6/1995 Holmes et al. ............................ 385/143
5,537,000 7/1996 Alivisatos et al. ...................... 313/506
5,670,791 9/1997 Halls et al. ................................ 257/40

FOREIGN PATENT DOCUMENTS 95 01871 1/1995 WIPO .

OTHER PUBLICATIONS

Berggren et al: "Light emitting diodes with variables colours from polymer blends", Nature, vol. 372, Dec. 1994, pp. 444–446.

Primary Examiner—Marie Yamnitzky
Attorney, Agent, or Firm—Pillsbury Madison & Sutro Intellectual Property Group LLP

[57] ABSTRACT

A light emitting polymer diode device for obtaining voltage controlled colors, based on thin polymer films incorporating more than one electroluminescent conjugated polymer and zero or more non-conjugated polymers, and where this polymer blend is formed by mixing the different polymers in a common solvent, which electroluminescent polymers phase separate in the polymer blend with domains of polymers that have a diameter comparable with the thickness of the polymer film, where the polymer film is sandwiched between two electrodes, one of which injects electrons and one which injects holes, possibly with electron and hole transport layers in between the polymer layer and the electrodes, and where the electrons and holes form excitons in the polymer film leading to emission of photons with colors determined by the bandgap of the emitting materials, and in which the more than one conjugated polymers have different emission colors, and where the polymers of lower bandgap emit light at a lower applied voltage than that which is necessary to induce light emission from the higher bandgap material, and where separation of the electroluminescent polymers from each other by the non-conjugated polymer effectively prevents the transfer of excitons from the higher bandgap polymer to that of lower bandgap, leading to an effective control of the colour of emission by applied voltage.

13 Claims, 2 Drawing Sheets

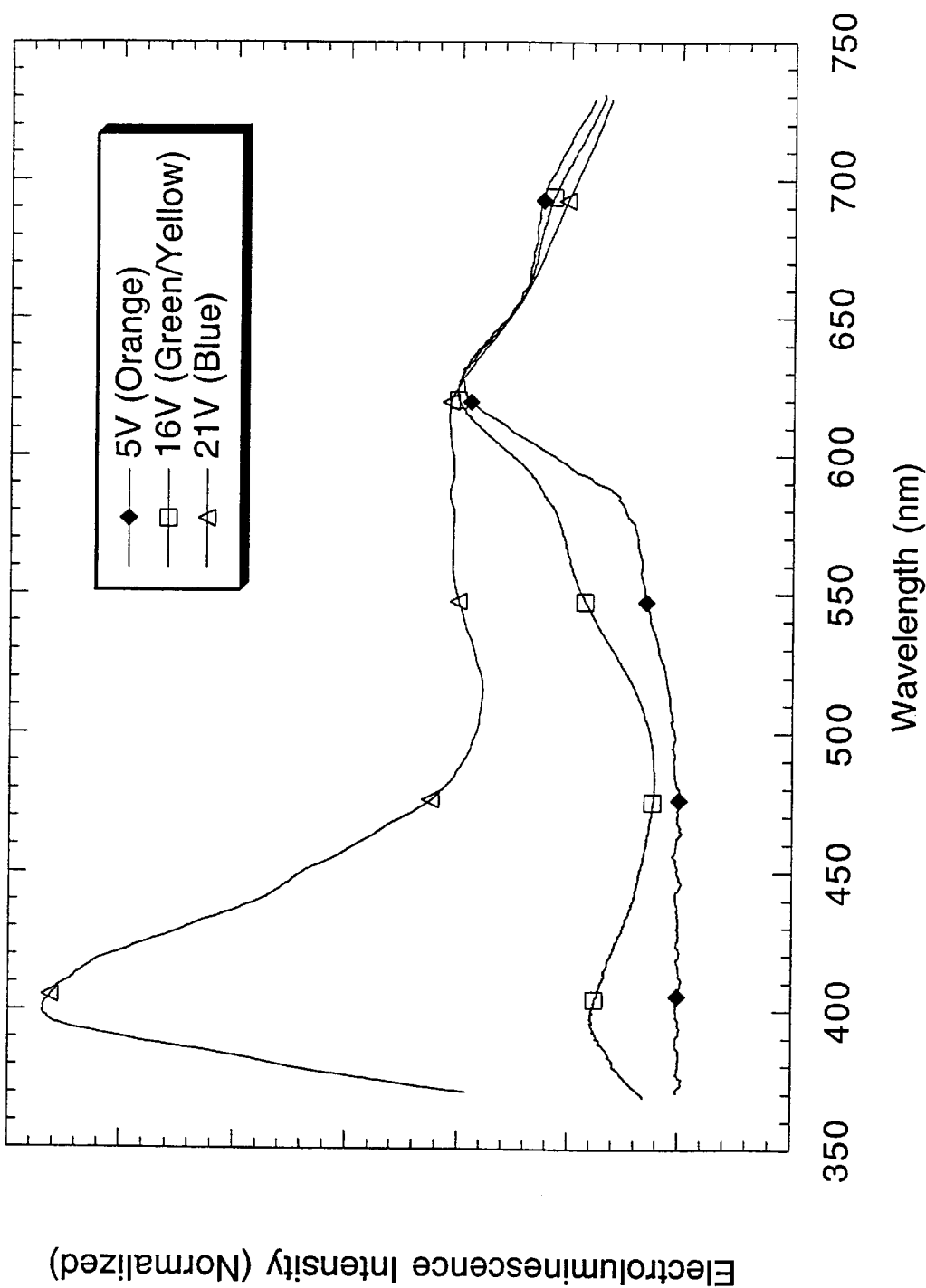

DEVICE FOR PRODUCING VOLTAGE CONTROLLED COLOR WITH ELECTROLUMINESCENCE, AND METHOD OF MAKING THE SAME

This application is the national phase of international application PCT/SE95/00549, filed May 16, 1995 which designated the U.S.

BACKGROUND OF THE INVENTION

The use of conjugated polymers in electroluminescent polymer diodes has been demonstrated by the group of prof. Richard Friend in Cambridge (J. H. Burroughes, D. D. C. Bradley, A. R. Brown, R. N. Marks, K. Mackay, R. H. Friend, P. L. Burns, and A. B. Holmes, Light-emitting diodes based on conjugated polymers, Nature, 347(6293), (1990) 539–41.) and received intense interest from a wide range of scientific and industrial groups in the U.S.;

(D. Braun and A. J. Heeger, Visible light emission from semiconducting polymer diodes, Appl. Phys. Lett., 58(18), (1991) 1982–4, D. Braun, A. J. Heeger, and H. Kroemer, Improved efficiency in semiconducting polymer light-emitting diodes, Journal of Electronic Materials, 20(11), (1991) 945–8.), Austria:

(G. Grem, G. Leditzky, B. Ullrich, and G. Leising, Realization of a blue-light-emitting device using poly(p-phenylene), Advanced Materials, 4(1), (1992) 36–7.G. Grem and G. Leising, Electroluminescence of wide-bandgap chemically tunable cyclic conjugated polymers, Synt. Metals, 57(1), (1993) 4105–4110.)

Germany: (S. Karg, W. Riess, M. Meier, and M. Schwoerer, Characterization of light-emitting-diodes and solar-cells based on poly-phenylene-vinylene, Synt. Metals, 57(1), (1993) 4186–4191.)

and Japan: (Y. Ohmori, M. Uchida, K. Muro, and K. Yoshino, Effects of alkyl chain length and carrier confinement layer on characteristics of poly(3-alkylthiophene) electroluminescent diodes, Solid State Commun., 80(8), (1991) 605–8, Y. Ohmori, M. Uchida, K. Muro, and K. Yoshino, Visible-light electroluminescent diodes utilizing poly(3-alkylthiophene), Japanese Journal of Applied Physics, Part 2, 30(11B), (1991) L1938–40., Y. Ohmori, M. Uchida, K. Muro, and K. Yoshino, Blue electroluminescent diodes utilizing poly(alkylfluorene), Japanese Journal of Applied Physics, Part, 30(11B), (1991) L1941–3.

These devices are prepared by sandwiching a thin film (0.05–1 $\mu$m) of a conjugated polymer in between two electrode materials. The polymer is characterized by a bandgap between approximately 1.5–4 eV, and the cathode injects electrons into the lowest unoccupied molecular orbitals (LUMO) of the polymers, while the cathode injects holes into the highest occupied molecular orbitals (HOMO) of the polymer. These opposite charges meet, recombine and electroluminescence is observed in the form of photon emission. Details in these processes are described in available literature ((R. H. Friend, J. H. Burroughes, and D. D. C. Bradley, Electroluminescent Devices, Patent Application PCT/GB90/00584, (1990) )(I.Parker: Carrier Injection and Device Characteristics in Polymer Light Emitting diodes, J.Appl.Phys 75 (1994) 1666.)).

A problem that has not yet received an effective solution is that of obtaining different colours from one individual polymer LED.

Many materials have today been shown to give electroluminescence in polymer LEDs, among which are found the main groups of (substituted) poly(paraphenylene vinylene) and (substituted) polyparaphenylenes. Using different substituents on these polymers, it is possible to obtain light with colours all the way from blue to green, yellow, orange and red. The colour of the polymer LED is given from the chemical and electronic structure of the polymer, and cannot be changed except by changing the polymer in the LED. Among these main chain polymers, with the various substituents, there is no one which covers the full range of the visible spectrum. There is therefore no way of forming a full colour polymer LED using these materials.

Another means of forming a polymer LED is to use a nonconjugated prepolymer and to convert this into different forms, capable of giving emission at different wavelength. The conversion occurs by thermal or chemical methods, or combinations thereof. It is therefore possible to pattern the prepolymer in such a way as to prepare pixels of different colours adjacent to each other. (P. L. Burn, A. B. Holmes, A. Kraft, D. D. C. Bradley, A. R. Brown, and R. H. Friend, Synthesis of a segmented conjugated polymer chain giving a blue-shifted electroluminescence and improved efficiency., J. Chem. Soc., Chem. Commun., (1992) 32., P. L. Burn, A. B. Holmes, A. Kraft, D. D. C. Bradley, A. R. Brown, R. H. Friend, and R. W. Gymer, Chemical tuning of electroluminescent copolymers to improve emission efficiencies and allow patterning, Nature, 356(6364), (1992)47–9.)

So far, there has not been demonstrated a prepolymer that can be converted to different conjugated forms which will give colours all over the full visible spectrum. The limited wavelength range attainable is a serious limitation; there is no possibility of forming red, blue and green pixels close to each other. The thermal/chemical conversion also affects the structure of the polymer layer, and residual chemicals, or vacancies, may exist in the converted polymer film. This may seriously affect the electrical and mechanical stability of the layer.

It has also been demonstrated how multilayers of conjugated polymers can be prepared by putting thin films on top of each other by spin coating. If these different layers have different colours of emission, it has been demonstrated that the resulting colour emission from the multilayer can be influenced by the applied voltage, by shifting the emission process between the different polymer layers. Some degree of colour control is attainable by this method, but this is a very limited freedom, as the different colours all fall in a narrow wavelength range. (A. R. Brown, N. C. Greenham, J. H. Burroughes, D. D. C. Bradley, R. H. Friend, P. L. Burn, A. Kraft, and A. B. Holmes, Electroluminescence from multilayer conjugated polymer devices: spatial control of exciton formation and emission, Chem. Phys. Lett., 200, (1992) 1–2.)

A very different means of obtaining colour control of the electroluminescence from thin organic layers has been presented by workers at Bell Labs, and others. Here a wide band emitter—normally a molecular compound—is positioned above an optical microcavity. The geometry of the cavity is chosen so as to give enhanced emission modes at red, green and blue wavelengths, respectively. In this way it is possible to generate pure elemental colours by patterning a surface with optical microcavities of different resonance wavelengths, and thus making adjacent red, green and blue pixels for obtaining a full colour screen.

(Dodabalapur-A Rothberg-L J Miller-T M "Electroluminescence from Organic Semiconductors in Patterned Microcavities" Electronics Letters Vol 30 Iss 12 pp 1000–1002 1994 (NV160)

Dodabalapur-A Rothberg-L J Miller-T M Kwock-E W: "Microcavity Effects in Organic Semiconductors" Applied Physics Letters Vol 64 Iss 19 pp 2486–2488 1994

Dodabalapur-A Rothberg-L J Miller-T M: "Color Variation with Electroluminescent Organic Semiconductors in Multimode Resonant Cavities" Applied Physics Letters Vol 65 Iss 18 pp 2308–2310 1994)

A rather different means of obtaining variable colours from polymer light emitting diodes is also reported (M. Uchida, Y. Ohmori, T. Noguchi, T. Ohnishi, and K. Yoshino, Color-variable light-emitting diode utilizing conducting polymer containing fluorescent dye, Japanese Journal of Applied Physics Part, 32, (1993)). The colour of the emitted light can be controlled by choosing different voltages to drive the diode. The diode is built from a conjugated polymer layer within which a conjugated molecule is dispersed. By choosing different forward voltages, smaller or larger emission from the conjugated molecule is observed. This is reported to occur at 70 K, during measurements inside a cryostat. The mechanism behind this phenomenon is not known. Such polymer/molecule combinations will however be rather unstable, as the molecule tends to crystallize inside the polymer matrix in the absence of strong attractive interactions between the molecule and polymer.

SUMMARY OF THE INVENTION

As is evident from this description, the known technique in this field is not capable of giving controlled display of colours with one and the same polymer diode, as may be of interest in the construction of full colour screens for computers and televisions and other display devices. The object of this invention is thus to provide such a device, and means for its construction.

Our invention consists In a polymer light emitting diode device that gives voltage controlled colours, and a means to prepare these. The device is based on a blend of conjugated polymers constituting the light emitting layer in the device. The blend is formed by mixing soluble conjugated polymers in a common solvent, and preparing a thin polymer film from this solution. The different polymers in the blend are chosen in such a way as to give emission in the colours required. For a white light, fully colour tunable device, this requires polymers giving emission in the red, blue and green. With different goals, for instance a yellow-green tunable light source, other combinations are possible.

Our invention is demonstrated using a family of conjugated polymers, namely side chain substituted polythiophenes. The substitutions are made so as to give steric interaction between the substituents and/or to the main chain. This forces the main chain out of planarity, and the bandgap of the polythiophene chain is increased with increasing torsion of chain. The electroluminescence from the different polymers can thus be made to cover the full range from the blue part of the spectrum into the infrared part. In order to cover this range, it is sufficient to use four distinct polymers. The chemical similarity of the polymers is appreciable, but they are sufficiently different to phase separate in the poly me r blend. Th is is very clear and well documented from studies of thin films of the polymer blends using scanning force microscopy (SFM). The size of the minority phase in binary blends is observed to be in the range between 50–200 nm (and possibly is 0.01 to 100 µm). It is therefore not possible to observe different spots of electroluninescent colours even with the optical microscope.

We have shown that polymer light emitting diodes based on such blends can be made to give varying colours with varying voltage. (Berggren, M.; Inganäs, O.; Gustafsson, G.; Rasmusson, J.; Andersson, M. R.; Hjertberg, T.; Wennerström, O. Nature 1994, 372, 444–446. ) The colour is based on emission from the separate polymers phase separated in the polymer blend. We can influence the colour tunability by choosing the stoichiometry in the polymer blends, as well as by choosing the voltage amplitude and duration. As we can use polymers emitting in all the different colours necessary for additive colour synthesis, we will be able to obtain white light and fully tunable colours from a wisely chosen polymer blend.

The mechanism operating here is very simple and related to the phase separation. The thickness of the polymer film is in the range 50–100 nm in our case. The domain size of the phase separated polymers (in the minority phase) is similar although the domain size may range from 0.01 µm (i.e., 10 nm) to 100 µm. As different polymers with different bandgap will phase separate into individual domains, of thickness comparable to width, we form a great number of individual diodes, based on the different polymer in the blend. These are all addressed by the same voltage applied to the electrodes. The voltage necessary for injection of both electrons and holes into a polymer is higher, the higher the bandgap of the polymer. At low voltages, the low bandgap materials are therefore the only light emitting areas. With higher voltage, the higher bandgap materias are turned on, until finally even the blue emitting polymers give electroluminescence. This explains the voltage variable colours.

Exciton transfer is a phenomenon that limits the colour tuneability of the PLEDs. Briefly, the exciton formed in the higher bandgap phase can, before emission of a photon, generate an exciton in the lower bandgap phases. This occurs by the induced dipole mechanism normally labeled Forster resonance. This means that a large fraction of the electron-hole pairs injected into the high energy material will eventually give rise to emission from the lower bandgap material. While it is certainly possible to partly compensate for this by choosing a polymer blend stoichiometry compensating for the exciton transfer, this may not be the most attractive suggestion. Rather, the inclusion of a nonconjugated polymer in the blend, chosen in such a way as to give phase separation with all the emitting polymers in the blend, and, in addition, chosen so as to make the emitting polymers form small islands in the nonconjugated polymer matrix. Even more, the non-conjugated polymer must be chosen so as not to form floor and ceiling beneath and above the polymer film formed from the blend. With the thin polymer films used in this device, this is often not a critical problem, as the phases formed may be much larger than the thickness of the film. It is, however, a delicate matter of choosing a polymer blend with such properties that all the luminescent properties prefer the environment of the matrix polymer (or polymers) rather than that of the other luminescent polymers—in order to prevent exciton transfer—and also such that there is no strong attraction of the matrix polymer for the substrate, as to form a thin insulating layer beneath the luminescents dots, neither such an attraction for the free surface that a insulating layer is formed on top of the luminescent dots. This would sacrifice charge injection properties in the PLED.

In this case, two or more electroluminescent polymers are blended with a non-conjugated polymer in a common solvent. Phase separation occurs as the solution is formed into a thin film, and the electroluminescent polymers form small dots in an insulating matrix. The stoichiometry is chosen to keep the dots apart from each other, so as not to allow direct exciton transfer through the $R^{-7}$ dominated Forster resonance. Indeed, the domains are observed to be much smaller than 1 µm, a lower limit for the patterning of individual pixels. By coating such a polymer blend onto a patterned (pixelled) surface, where individual electrodes are of the dimension 10–100 μm on a side, it will be possible to generate all different colours at all pixels, with no separate pixels for red, green and blue.

It is possible to vary the voltage-time cycle of the PLED in order to define brightness and colour. Higher voltages will give higher currents and more photons. It is thus possible to use a long duty cycle at low voltages and short duty cycles at high voltages, all with the consideration that the human eye should not be capable of distinguishing the time variations of the photon flux, but rather see a continuous and steady light source of variable colour.

BRIEF DESCRIPTION OF THE DRAWINGS

FIG. 2 shows plots of voltage controlled colors from a three color—orange, green, blue—polymer light-emitting diode. This sample was prepared according to Example 8, and included PTOPT, PCHT and PCHMT. Emission was observed from all three electroluminescent polymers, and the ratio between the emission peaks can be controlled by the voltage.

DETAILED DESCRIPTION

EXAMPLES

Example 1

Figure 1:
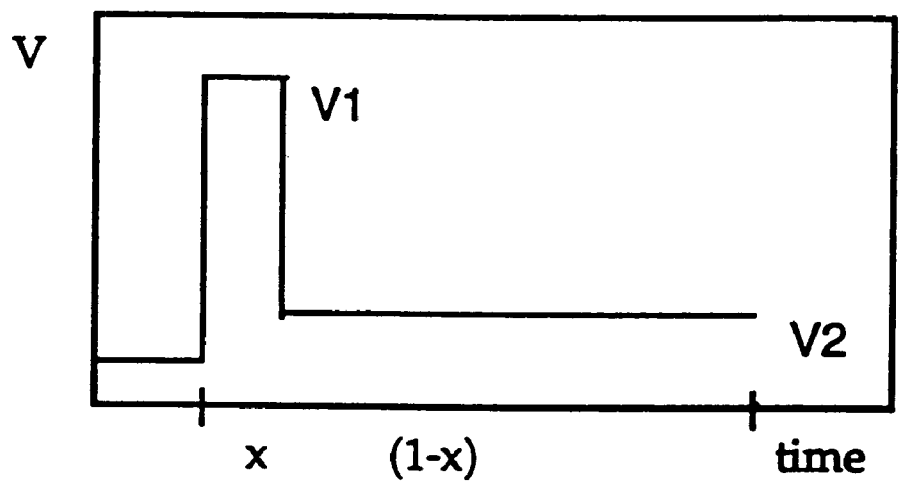
FIG. 1 shows a plot of color and intensity modulation using an average variable voltage-time profile, during a clock cycle of the light source. During a fraction x of the duty cycle, the higher voltage V1 is applied, inducing emission from the higher bandgap materials; during the fraction (1-x) V2 is applied, only stimulating emission from the low bandgap materials.

A solution of a polymer blend is prepared by dissolving 0.4 mg poly(3-4-octylphenyl-thiophene (POPT) and 4 mg of poly(3-4-cyclohexylthiophene) (PCHT) in 1 ml chloroform, to make the mole ratio of 1 mer of POPT/9 mers PCHT. This solution is spin coated on top of an indium tin oxide coated glass wafer, and gives a polymer film of thickness 0.01–1 μm, depending on spin coater velocity. A metallic electrode (Al/Ca) is vacuum evaporated onto the polymer layer. The sample is converted using a short thermal treatment. The metal electrode is connected to the negative voltage of a power supply, and a voltage in the range 0–30 V is applied to the structure, with a polymer film of 0.04 μm thickness. At 4 V red light is emitted from the LED; at 7 V a red-green colour is obtained, due to the green contribution from PCHT.

Example 2

A solution of a polymer blend is prepared by dissolving 0.4 mg poly(3-4-octylphenyl-2.2'-bithiophene (PTOPT) and 4 mg of poly(3-4-cyclohexylthiophene) (PCHT) in 1 ml chloroform, to make the mole ratio of 1 mer of PTOPT/7 mers PCHT. This solution is spin coated on top of an indium tin oxide coated glass wafer, and gives a polymer film of thickness 0.01–1 μm, depending on spin coater velocity. A metallic electrode (Al/Ca) is vacuum evaporated onto the polymer layer. The metal electrode is connected to the negative voltage of a power supply, and a voltage in the range 0–30 V is applied to the structure, with a polymer film of 0.04 μm thickness. At 4 V orange light is emitted from the LED; at 7 V a yellow colour is obtained, due to the green contribution from PCHT.

Example 3

A solution of a polymer blend is prepared by dissolving 0.4 mg poly(3-4-octylphenyl-2.2'-bithiophene (PTOPT) and 4 mg of poly(3-4-cyclohexyl, 2 methylthiophene) (PCHMT) in 1 ml chloroform, to make the mole ratio of 1 mer of PTOPT/6.5 mers PCHMT. This solution is spin coated on top of an indium tin oxide coated glass wafer, and gives a polymer film of thickness 0.01–1 μm, depending on spin coater velocity. A layer of the molecule 2-(4-biphenylyl)-5-(4-tertbutylphenyl) 1,3,4-oxadiazole is thermally evaporated on the polymer layer. A metallic electrode (Al/Ca or Al) is vacuum evaporated onto the polymer layer. The metal electrode is connected to the negative voltage of a power supply, and a voltage in the range 0–30 V is applied to the structure, with a polymer film of 0.04 μm thickness. At 20V red light is emitted from the LED; at 27 V a bluish white colour is obtained, due to the blue contribution from PCHMT.

Example 4

A solution of a polymer blend is prepared by dissolving 0.4 mg poly(3-4-octylphenyl-thiophene (POPT) and 4 mg of poly(3-4-cyclohexyl, 2 methylthiophene) (PCHMT) in 1 ml chloroform, to make the mole ratio of 1 mer of POPT/10 mers PCHMT. This solution is spin coated on top of an indium tin oxide coated glass wafer, and gives a polymer film of thickness 0.01–1 μm, depending on spin coater velocity. The sample is converted using a short thermal treatment. A layer of the molecule 2-(4-biphenylyl)-5-(4-tertbutylphenyl)1,3,4-oxadiazole is thermally evaporated on the polymer layer. A metallic electrode (Al/Ca or Al) is vacuum evaporated onto the polymer layer. The metal electrode is connected to the negative voltage of a power supply, and a voltage in the range 0–30 V is applied to the structure, with a polymer film of 0.04 μm thickness. At 20V red and near infrared light is emitted from the LED; at 30 V a bluish white colour is obtained, due to the blue contribution from PCHMT.

Example 5

A polymer solution of POPT and PCHT in chloroform, to make the mole ratio of 1 POPT/20 PCHT is coated onto a indium tin oxide coated glass substrate. After the preparation, the sample is either exposed to the vapour of chloroform, or mildly heated. This converts the POPT phase into a lower bandgap material. An Al/Ca top electrode is coated by vacuum evaporation. The metal electrode is connected to the negative voltage of a power supply, and a voltage in the range 0–10 V is applied to the structure, with a polymer film of 0.04 μm thickness. The red and near infrared emission from the converted POPT phase in combination with the yellow/green emission from the PCHT combine to give different colours in the lower energy part of the visible spectrum.

Example 6

A polymer blend solution of POPT and PCHT in mole ratio of 1:10–1:30 is spin coated onto a metallic cathode, like Mg, Al, In, Cu. The metal is in the form of a thin layer on top of a flexible substrate, a overhead film of poly(ethylene terephtalate). This structure is melt pressed to a indium tin oxide coated glass substrate until th polymer layer fuses onto both electrodes.

Example 7

A solution of a polymer blend is prepared by dissolving 2 mg poly[3-(4-cyclohexyl)thiophene] (PCHT), 1 mg of poly[3-(4-octylphenyl)thiophene] (POPT) and 1 mg of polycarbonate (non-conjugated polymer used as exciton blocking matrix) in 1 mg chloroform. This solution is spin coated on top of an indium tin oxide glass wafer, and gives a polymer film thickness between 0.01 and 1 µm, depending on spin coating velocity. A metallic electrode (Al/Ca or Al) is vacuum evaporated on the polymer layer. The metal layer is connected to the negative output of a voltage supply and the indium tin oxide to the positive. A voltage in the range of 0–20 V is applied to the structure, with a polymer film thickness of 0.04 mm. At 3 V red light is emitted from the LED, at 10 V a yellow colour is obtained and at 14 V the emission is yellowish green when the PCHT contributes to the largest amount of the emission.

Example 8

A solution of a polymer blend is prepared by dissolving 5 mg poly[3-(4-cyclohexyl)-2-methylthiophene] (PCHMT), 5 mg poly[3-(4-cyclohexyl)thiophene] (PCHT), 1 mg of poly [3-(4-octylphenyl)-2,2'-bithiophene] (PTOPT) and 1 mg of polymethylmethacrylate (PMMA) (non-conjugated polymer used as exciton blocking matrix) in 3 mg chloroform. This solution is spin coated on top of an indium tin oxide coated glass wafer, and gives a polymer film thickness between 0.01 and 1 µm, depending on spin coating velocity. On top of the polymer layer a layer of 2-(4-biphenylyl)-5-(4-tertbutylphenyl)1,3,4-oxadiazole (PBD) of 0.9–1.2 µm thickness is vacuum evaporated. A metallic electrode (Al/Ca or Al) is vacuum evaporated on the PBD layer. The metal layer is connected to the negative output of a voltage supply and the indium tin oxide to the positive. A voltage in the range of 0–30 V is applied to the structure, with a polymer film thickness of 0.04 µm. At 5 V the emission from the diode is orange, and for increasing voltages it passes yellow, green and blue-green to reach a blue colour at 20 V.

What is claimed is:

1. A light source device for producing voltage controlled colors with electroluminescence, said light source device comprising:

a polymeric light-emitting diode comprising a polymeric film and optionally transport control layers, said polymeric film comprising a blend of polymers, said transport control layers, when present, being constructed and arranged to control electron and hole transport; and a hole-injecting electrode constructed and arranged to inject holes into said polymer film and an electron-injecting electrode constructed and arranged to inject electrons into said polymeric film, said hole-injecting electrode and electron-injecting electrode sandwiching said polymeric light-emitting diode, at least one of said hole-injecting electrode and said electrode-injecting electrode being transparent or semi-transparent, wherein said blend of polymers includes a plurality of electroluminescent conjugated polymers which are phase separated from one another so that application of voltages across said electrodes generates electroluminescence from said blend of polymers, said electroluminescence comprising a mixture of emissions of said electroluminescent conjugated polymers which is controllable by varying voltage applied across said electrodes.

2. The light source device of claim 1, wherein said electroluminescent conjugated polymers include a plurality of members selected from the group consisting of polythiophenes, poly(paraphenylenes), and poly (paraphenylene vinylene), at least some of said members having substituents selected from the group consisting of alkyl, alkoxy, cycloalkyl, cycloalkoxy, fluoroalkyl, alkylphenylene, and alkoxyphenylene vinylene, and wherein each one of said electroluminescent conjugated polymers produces a specific wavelength of electroluminescence.

3. The light source device of claim 1, wherein said electroluminescent conjugated polymers include a plurality of substituted polythiophenes having substituents selected and arranged to control steric hindrance between said substituents and between said substituents and backbones from which said substituents depend so that said backbones have planarities which permit emission of electroluminescence colors spanning from blue into near infrared.

4. The light source device of claim 1, wherein ones of said electroluminescent conjugated polymers individually making up a minority portion of said polymer blend are present in separate phases having dimensions of from 0.01 to 100 µm.

5. The light source device of claim 1, wherein said blend of polymers includes, in addition to said plurality of electroluminescent conjugated polymers, at least one non-conjugated polymer selected to provide optical, mechanical, and thermal properties to said light-emitting diode.

6. The light source device of claim 1, wherein said blend of polymers includes, in addition to said plurality of electroluminescent conjugated polymers, one or more non-conjugated polymers, and wherein phase separation among all of said electroluminescent conjugated polymers are separated from each other by said non-conjugated polymers, and wherein stoichiometry is chosen so as to prevent exciton transfer between said electroluminescent conjugated polymers.

7. The light source device of claim 1, wherein said electron-injecting electrode includes a metal or metal alloy layer, doped semiconductors, or doped polymers with a low work function.

8. The light source device of claim 7, wherein said electron-injecting electrode is in contact with one of said transport control layers.

9. The light source device of claim 1, wherein said hole-injecting electrode includes a metal or metal alloy layer, doped semiconductors, or doped polymers with a high work function.

10. The light source device of claim 9, wherein said hole-injecting electrode is in contact with one of said transport control layers.

11. The light source device of claim 1, wherein said plurality of electroluminescent conjugated polymers includes at least one substituted polythiophene having a bandgap modifiable by thermal conversion of said polymer film so that said substituted polythiophene is convertible into a different bandgap.

12. A method for producing voltage controlled colors with electroluminescence, said method comprising:

providing a light source device comprising:

a polymeric light-emitting diode comprising a polymeric film and optionally transport control layers, said polymeric film comprising a blend of polymers, the transport control layers, when present being constructed and arranged to control electron and hole transport; and a hole-injecting electrode constructed and arranged to inject holes into the polymer film and an electron-injecting electrode constructed and arranged to inject electrons into the polymeric film, the hole-injecting electrode and the electron-injecting electrode sandwiching the polymeric light-emitting diode, at least one of the hole-injecting electrode and the electrode-injecting electrode being transparent or semi-transparent, wherein the blend of polymers includes a plurality of electroluminescent conjugated polymers which are phase separated from one another so that application of voltages across said electrodes generates electroluminescence from the blend of polymers, the electroluminescence comprising a mixture of emissions of the electroluminescent conjugated polymers which is controllable by varying voltage applied across said electrodes; and varying voltages applied across the electrodes with a voltage-time duty cycle comprising higher voltages for short periods of the duty cycle and lower voltages for remaining parts of the duty cycle, the voltage and the voltage-time duty cycle being selected to present an illusion of true color to a human eye.

13. A method for preparing a light source device suitable for producing voltage controlled colors, said method comprising:

blending a plurality of electroluminescent conjugated polymers and optionally one or more non-conjugated polymers in a solvent to produce a polymer blend in which the electroluminescent conjugated polymers are phase separated from one another;

spin coating or solution casting the polymer blend on top of a first electrode selected from the group consisting of an electron-injecting electrode or hole-injecting electrode to form an electroluminescent polymeric film; and contacting said electroluminescent polymeric film with a second electrode selected from the group consisting of an electron-injecting electrode and a hole-injecting electrode.

* * * * *